United States Patent
Nagai

(10) Patent No.: US 10,158,280 B2
(45) Date of Patent: Dec. 18, 2018

(54) SIGNAL GENERATION CIRCUIT

(71) Applicant: Panasonic Intellectual Property Management Co., Ltd., Osaka (JP)

(72) Inventor: Shuichi Nagai, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 435 days.

(21) Appl. No.: 15/158,585

(22) Filed: May 19, 2016

(65) Prior Publication Data

US 2016/0352122 A1 Dec. 1, 2016

(30) Foreign Application Priority Data

May 25, 2015 (JP) .................. 2015-105059

(51) Int. Cl.
| | |
|---|---|
| H02M 1/08 | (2006.01) |
| H03K 17/0412 | (2006.01) |
| H03K 17/691 | (2006.01) |

(52) U.S. Cl.
CPC ........ *H02M 1/08* (2013.01); *H03K 17/04123* (2013.01); *H03K 17/691* (2013.01); *H03K 2217/0081* (2013.01)

(58) Field of Classification Search
CPC ...................................... H02M 1/08
USPC ......................................................... 320/107
See application file for complete search history.

(56) References Cited

U.S. PATENT DOCUMENTS

2015/0234417 A1    8/2015 Kawai et al.

FOREIGN PATENT DOCUMENTS

WO    2015/029363    3/2015

*Primary Examiner* — Drew A Dunn
*Assistant Examiner* — Jerry D Robbins
(74) *Attorney, Agent, or Firm* — McDermott Will & Emery LLP

(57) ABSTRACT

A charging-voltage generating unit generates voltage which charges a charge storage element from one input signal. An output-voltage generating unit generates voltage referenced to a signal output reference terminal and output at a signal output terminal from another input signal. A charging-voltage output terminal and first terminals of a first switching element and the charge storage element are connected at a first point. A charging-voltage output reference terminal is connected with a second terminal of the first switching element at a second point. An output-voltage output terminal, a first terminal of a second switching element, and the signal output terminal are connected at a third point. The output-voltage output reference terminal, a signal output reference terminal, and second terminals of the second switching element and the charge storage element are connected at a fourth point. The second and third points are interconnected.

19 Claims, 8 Drawing Sheets

SIGNAL GENERATION CIRCUIT

BACKGROUND

1. Technical Field

The present disclosure relates to a signal generation circuit that generates a prescribed output signal.

2. Description of the Related Art

International Publication No. 2015/029363 discloses a gate driving circuit that serves as a signal generation circuit for generating gate driving signals to drive a semiconductor switching element.

SUMMARY

In conventional techniques, demand exists for generating an output signal having a large peak current.

In one general aspect, the techniques disclosed here feature a signal generation circuit including: a charging voltage generating unit; an output voltage generating unit; a first switching element; a second switching element; a charge storage element; a signal output terminal; and a signal output reference terminal, in which the charging voltage generating unit includes a first signal input terminal, a first signal input reference terminal, a charging voltage output terminal, and a charging voltage output reference terminal; the output voltage generating unit includes a second signal input terminal, a second signal input reference terminal, an output-voltage output terminal, and an output-voltage output reference terminal; to the first signal input terminal, a first input signal which is referenced to the first signal input reference terminal is input; to the second signal input terminal, a second input signal which is referenced to the second signal input reference terminal is input; the charging voltage generating unit generates a voltage which charges the charge storage element from the first input signal; the output voltage generating unit generates a voltage which is referenced to the signal output reference terminal and which is output at the signal output terminal from the second input signal; the charging voltage output terminal is connected with a first terminal of the first switching element at a first connection point; the charging voltage output reference terminal is connected with a second terminal of the first switching element at a second connection point; the output-voltage output terminal is connected with a first terminal of the second switching element at a third connection point; the output-voltage output reference terminal is connected with a second terminal of the second switching element at a fourth connection point; the third connection point is connected with the signal output terminal; the fourth connection point is connected with the signal output reference terminal; the second connection point and the third connection point are connected to each other; a first terminal of the charge storage element is connected with the first connection point; and a second terminal of the charge storage element is connected with the fourth connection point.

According to the present disclosure, an output signal having a large peak current can be generated.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Embodiments of the present disclosure will be described below with reference to the drawings.

Note that the embodiments described below all illustrate general or specific examples. Numerical values, geometries, materials, components, the arrangement positions and forms of connection of components, steps, the order of steps, and the like shown in the embodiments described below are merely illustrative and are not intended to limit the present disclosure. Components that are described in the embodiments below and not set forth in an independent claim representing the most generic concept of the present disclosure are described as optional components.

First Embodiment

Figure 1:
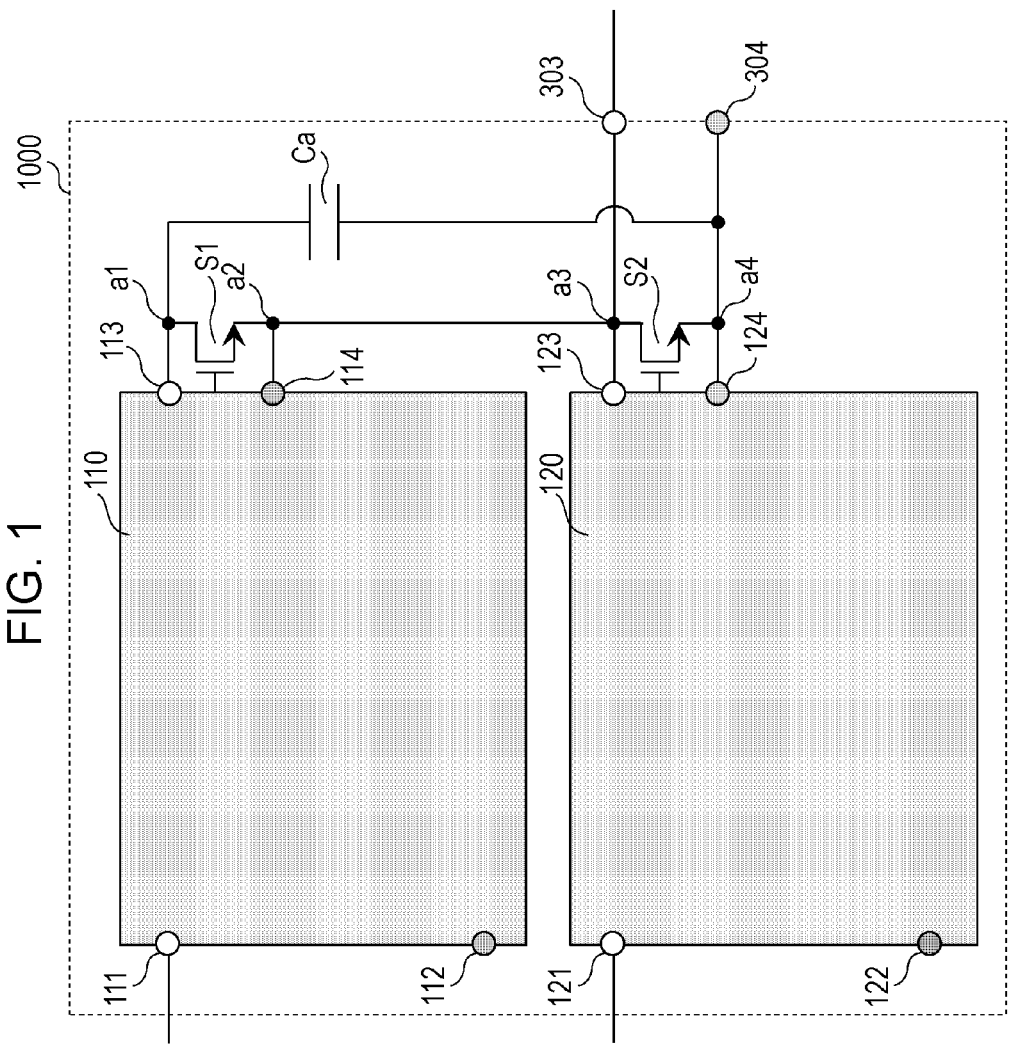
FIG. 1 is a circuit diagram schematically showing a configuration of a signal generation circuit 1000 according to a first embodiment of the present disclosure.

FIG. 1 is a circuit diagram schematically showing a configuration of a signal generation circuit 1000 (e.g., signal generating circuit) according to a first embodiment of the present disclosure.

The signal generation circuit 1000 in the first embodiment includes a charging voltage generating unit 110, an output voltage generating unit 120, a first switching element S1, a second switching element S2, a charge storage element Ca, a signal output terminal 303, and a signal output reference terminal 304.

The charging voltage generating unit 110 includes a first signal input terminal 111, a first signal input reference terminal 112, a charging voltage output terminal 113, and a charging voltage output reference terminal 114.

The output voltage generating unit 120 includes a second signal input terminal 121, a second signal input reference terminal 122, an output-voltage output terminal 123, and an output-voltage output reference terminal 124.

To the first signal input terminal 111, a first input signal which is referenced to the first signal input reference terminal 112 is input.

To the second signal input terminal 121, a second input signal which is referenced to the second signal input reference terminal 122 is input.

The charging voltage generating unit 110 generates a voltage which charges the charge storage element Ca from the first input signal.

The output voltage generating unit 120 generates a voltage which is referenced to the signal output reference terminal 304 and which is output at the signal output terminal 303 from the second input signal.

The charging voltage output terminal 113 is connected with a first terminal (for example, the drain terminal) of the first switching element S1 at a first connection point a1 (e.g., first node).

The charging voltage output reference terminal 114 is connected with a second terminal (for example, the source terminal) of the first switching element S1 at a second connection point a2 (e.g., second node).

The output-voltage output terminal 123 is connected with a first terminal (for example, the drain terminal) of the second switching element S2 at a third connection point a3 (e.g., third node).

The output-voltage output reference terminal 124 is connected with a second terminal (for example, the source terminal) of the second switching element S2 at a fourth connection point a4 (e.g., fourth node).

The third connection point a3 is connected with the signal output terminal 303.

The fourth connection point a4 is connected with the signal output reference terminal 304.

The second connection point a2 and the third connection point a3 are connected to each other.

A first terminal of the charge storage element Ca is connected with the first connection point a1.

A second terminal of the charge storage element Ca is connected with the fourth connection point a4.

With this configuration, an output signal in which the electric charge of the charge storage element is superimposed on the output voltage from the output voltage generating unit can be generated. That is, an output signal having a large peak current can be generated. Thus, if the output signal is used as the gate driving signal for a power semiconductor device, for example, a charge can be rapidly applied to the gate of the power semiconductor device. By doing so, the gate voltage of the power semiconductor device can be rapidly raised, enabling fast switching of the power semiconductor device. In addition, rapid raising of the gate voltage can reduce switching loss.

The configuration described above also makes it possible to adjust the peak current during its rise by adjusting the strength of the first input signal input to the first signal input terminal. Likewise, by adjusting the strength of the second input signal input to the second signal input terminal, the strength of the output signal (for example, the strength of the voltage for maintaining the on-state of the power semiconductor device) can be adjusted. This permits more accurate control of driving of the power semiconductor device, for example.

In the signal generation circuit 1000 according to the first embodiment, the charging voltage generating unit 110 may also generate a voltage which places the first switching element S1 into the off-state from the first input signal and output the voltage to a conduction control terminal (for example, the gate terminal) of the first switching element S1.

In the signal generation circuit 1000 according to the first embodiment, the output voltage generating unit 120 may generate a voltage which places the second switching element S2 into the off-state from the second input signal and output the voltage to the conduction control terminal (for example, the gate terminal) of the second switching element S2.

With such a configuration, the voltage for conduction control of the first switching element and the voltage for storing charge in the charge storage element can be generated from the same input signal (that is, the first input signal input to the first signal input terminal). Accordingly, an output signal having a large peak current can be generated based on two input signals (that is, the first input signal input to the first signal input terminal and the second input signal input to the second signal input terminal). This can decrease the number of insulating elements used even in, for example, a case where a signal transmitted with electrical isolation by means of insulating elements is used as the input signal, and hence the size of the signal generation circuit can be reduced.

The driving control signals to be input to the conduction control terminal of the first switching element and the conduction control terminal of the second switching element may be generated by a control circuit separate from the charging voltage generating unit and the output voltage generating unit.

In the first embodiment, the charge storage element Ca may be a capacitor. That is, for the charge storage element Ca, an element capable of temporarily storing electric charge can be employed.

In the first embodiment, the first switching element S1 or the second switching element S2 may be a transistor.

For instance, the first switching element S1 or the second switching element S2 may be an N-type field-effect transistor using a nitride semiconductor.

For example, the first switching element S1 or the second switching element S2 may also be a normally-on transistor (for example, P-type).

A normally-on transistor is a depletion transistor. That is, a normally-on transistor is a transistor whose operating gate voltage is a negative voltage. For example, when the gate voltage is lower than a threshold (for example, −3 V) relative to the source voltage, the resistance between the drain and the source becomes high (the off-state). Conversely, when the gate voltage is higher than a threshold (for example, −3 V) relative to the source voltage, current flows between the drain and the source (the on-state). When the gate voltage and the source voltage are at the same potential, the drain and the source have continuity between them.

Figure 2:
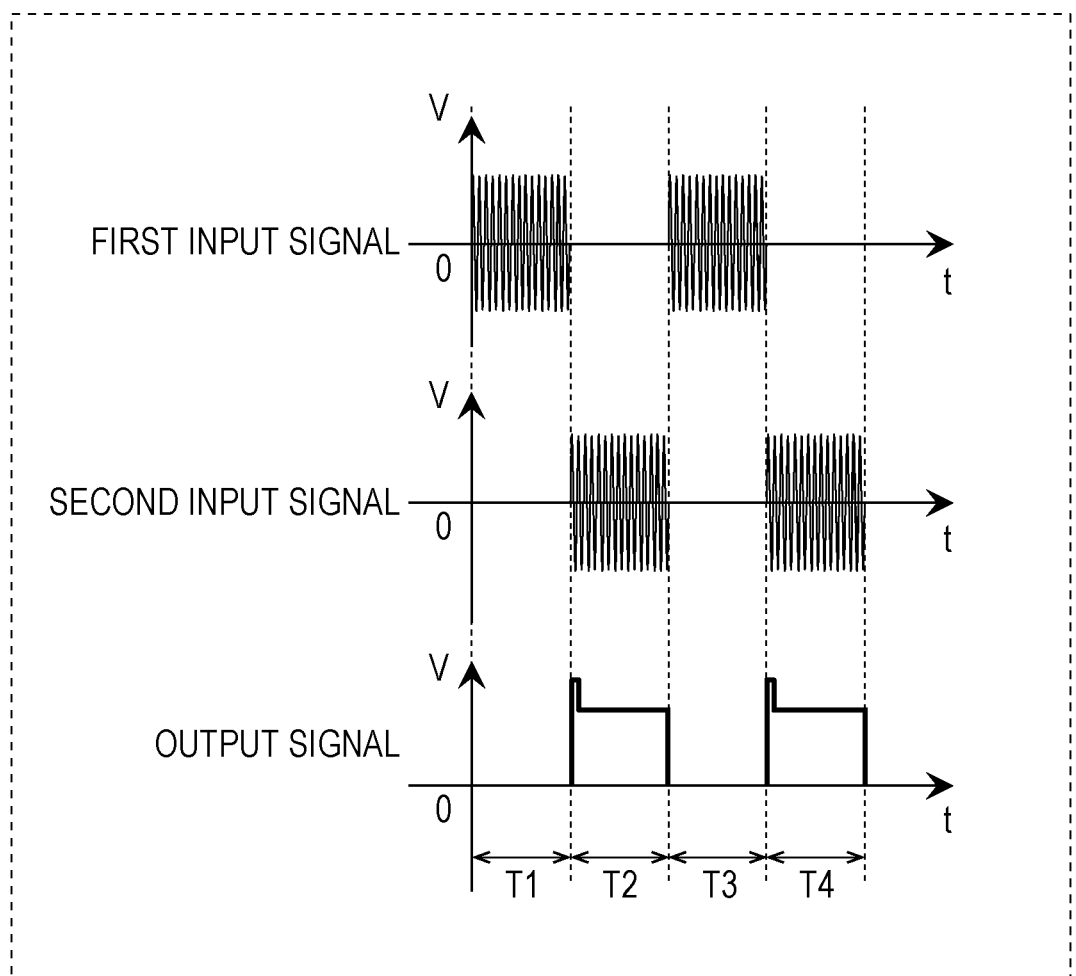
FIG. 2 is a diagram showing examples of the first input signal, the second input signal, and the output signal.

FIG. 2 is a diagram showing examples of the first input signal, the second input signal, and the output signal.

The first input signal includes a first signal having a first amplitude and a second signal having a second amplitude.

The first amplitude is an amplitude greater than the second amplitude.

The second input signal includes a third signal having a third amplitude and a fourth signal having a fourth amplitude.

The fourth amplitude is an amplitude greater than the third amplitude.

A time period during which the first signal is input to the first signal input terminal and a time period during which the third signal is input to the second signal input terminal may overlap partially or totally (for example, time period T1 or time period T3 in FIG. 2).

A time period during which the second signal is input to the first signal input terminal and a time period during which the fourth signal is input to the second signal input terminal may overlap partially or totally (for example, time period T2 or time period T4 in FIG. 2).

Under these conditions, the charging voltage generating unit 110 may generate a voltage for charging the charge storage element Ca from the first signal.

The charging voltage generating unit 110 may also generate a voltage which places the first switching element S1 into the off-state from the first signal and output the voltage to the conduction control terminal of the first switching element S1.

The output voltage generating unit 120 may generate a voltage to be output at the signal output terminal 303 from the fourth signal.

The output voltage generating unit 120 may also generate a voltage which places the second switching element S2 into the off-state from the fourth signal and output the voltage to the conduction control terminal of the second switching element S2.

With this configuration, the peak current can be added to individual output signals even in a case where multiple output signals are intermittently generated, for example. For instance, as in the example shown in FIG. 2, an output signal having a large peak current can be generated in time period T2 and time period T4.

In the first embodiment, the first input signal and the second input signal may be in a complementary relationship to each other.

Alternatively, the time period during which the first signal is input to the first signal input terminal and the time period during which the fourth signal is input to the second signal input terminal may overlap one another.

Alternatively, the time period during which the second signal is input to the first signal input terminal and the time period during which the third signal is input to the second signal input terminal may overlap one another.

The first input signal or the second input signal may be a signal having three or more signal strength values.

In the first embodiment, there may be a time period during which neither the first input signal nor the second input signal is output.

Figure 3:
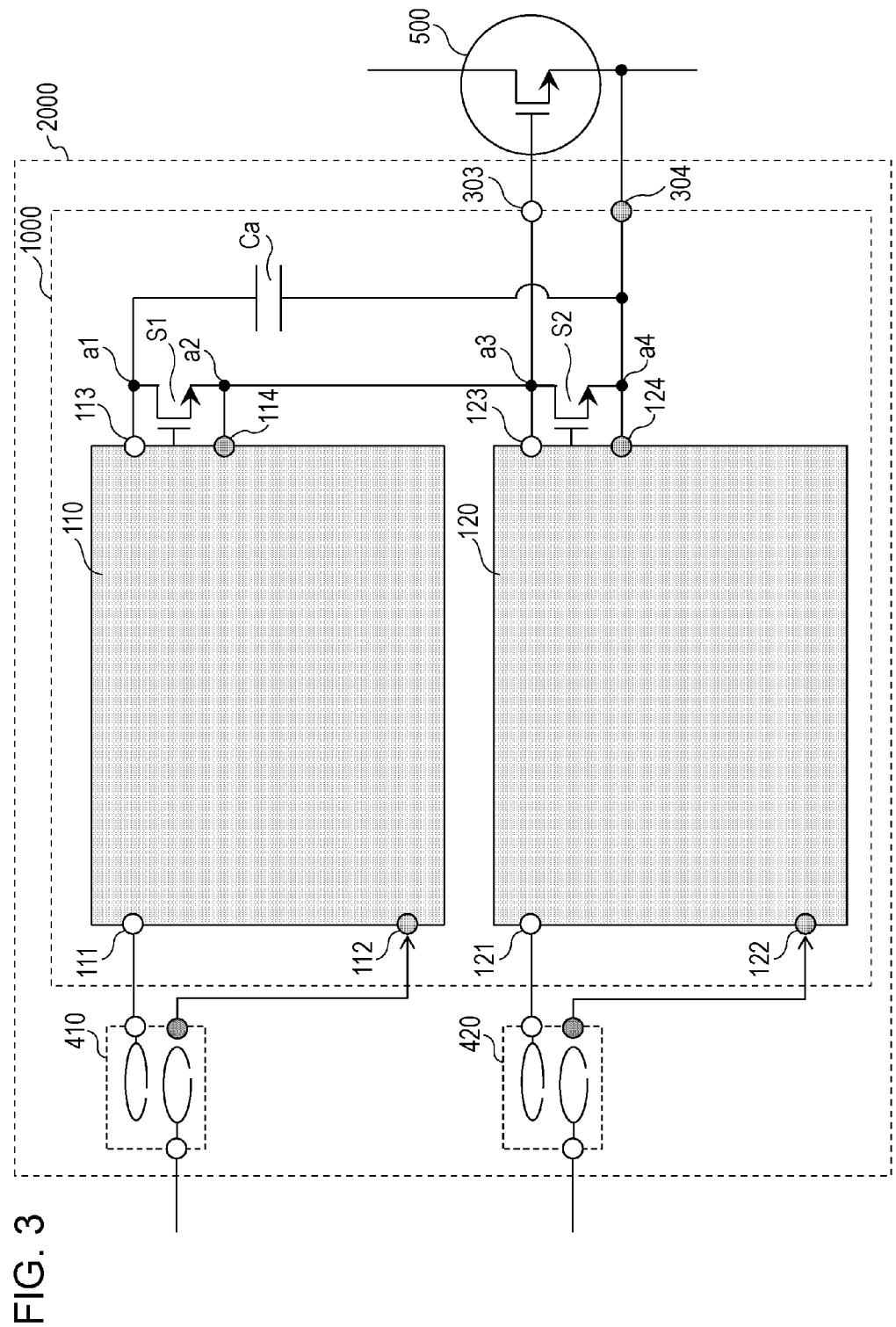
FIG. 3 is a circuit diagram schematically showing the configuration of a signal generation circuit 2000 according to the first embodiment.

FIG. 3 is a circuit diagram schematically showing the configuration of a signal generation circuit 2000 according to the first embodiment.

As shown by the signal generation circuit 2000 in FIG. 3, the signal generation circuit in the first embodiment may further include a first insulating element 410 and a second insulating element 420 in addition to the components of the signal generation circuit 1000 described above.

In such an implementation, the first input signal may be a signal that has been transmitted with electrical isolation via the first insulating element 410.

The second input signal may be a signal that has been transmitted with electrical isolation via the second insulating element 420.

In the first embodiment, the first insulating element 410 may be a first electromagnetic field resonance coupler.

In the first embodiment, the second insulating element 420 may be a second electromagnetic field resonance coupler.

In such an implementation, the first input signal may be a high frequency signal that has been transmitted with electrical isolation via the first electromagnetic field resonance coupler.

The second input signal may be a high frequency signal that has been transmitted with electrical isolation via the second electromagnetic field resonance coupler.

The frequency of the high frequency signal transmitted with electrical isolation via an electromagnetic field resonance coupler may be higher than that of the output signal generated by the signal generation circuit 2000.

For example, the frequency of a high frequency signal transmitted with electrical isolation by an electromagnetic field resonance coupler is 100 MHz or higher.

For example, the frequency of the output signal generated by the signal generation circuit 2000 is from 100 kHz to several MHz.

In the first embodiment, the output-side reference terminal of the first insulating element 410 may be connected with the first signal input reference terminal 112.

In that case, a capacitor may be provided between the output-side reference terminal of the first insulating element 410 and the first signal input reference terminal 112.

In the first embodiment, the output-side reference terminal of the second insulating element 420 may be connected with the second signal input reference terminal 122.

In that case, a capacitor may be provided between the output-side reference terminal of the second insulating element 420 and the second signal input reference terminal 122.

Also, as shown in FIG. 3, a switching element 500 may be driven by the output signal from the signal generation circuit in the first embodiment.

In that case, the signal output terminal 303 is connected to the gate terminal of the switching element 500.

The signal output reference terminal 304 is connected to the source terminal of the switching element 500.

Inputting of the output signal from the signal output terminal 303 to the switching element 500 as the gate signal controls the on and off of the switching element 500.

Here, the frequency of the output signal from the signal output terminal 303 may be about 100 kHz to several MHz, for example.

The switching element 500 may be a power semiconductor device such as insulated gate bipolar transistor (IGBT), for example.

As the signal generation circuit 2000 described above, the gate driving signal for a power semiconductor device may be generated on the basis of an input signal transmitted with electrical isolation via an insulating element.

With the configuration described, driving signals having a large peak current can be supplied to a power semiconductor device while effecting insulation between the input side and the power semiconductor device side by way of insulating elements.

Second Embodiment

A second embodiment of the present disclosure will be described below as a specific example of the configuration of the first embodiment. The descriptions common to the first embodiment described above will be omitted appropriately.

Figure 4:
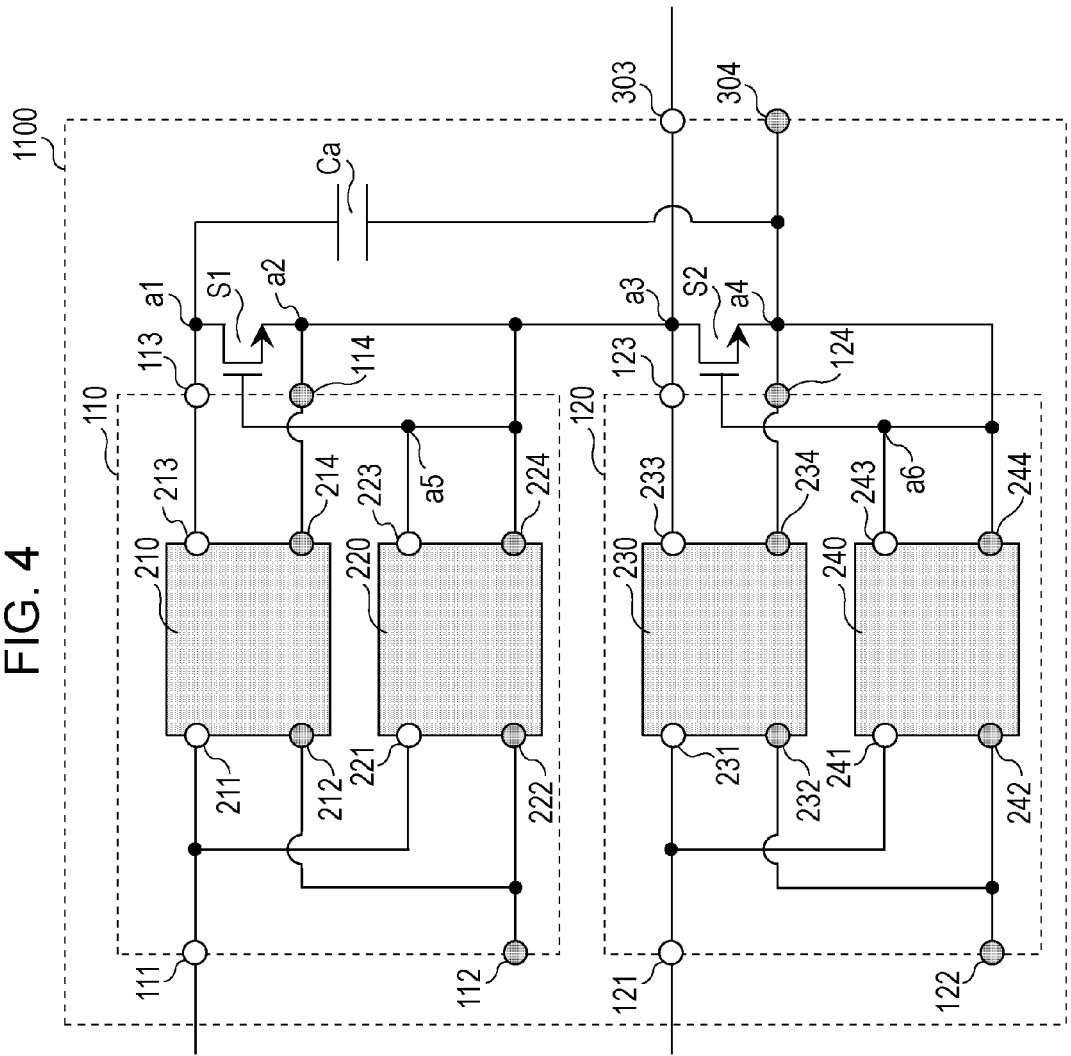
FIG. 4 is a circuit diagram schematically showing the configuration of a signal generation circuit 1100 according to a second embodiment.

FIG. 4 is a circuit diagram schematically showing the configuration of a signal generation circuit 1100 according to the second embodiment.

In the signal generation circuit 1100 according to the second embodiment, the charging voltage generating unit 110 includes a first rectifying unit 210 and a second rectifying unit 220.

The first rectifying unit 210 includes an input terminal 211, an input reference terminal 212, an output terminal 213, and an output reference terminal 214.

To the input terminal 211, part of the first input signal, which is a signal to be rectified, is input with reference to the input reference terminal 212.

From the output terminal 213, a rectified signal is output with reference to the output reference terminal 214.

The second rectifying unit 220 includes an input terminal 221, an input reference terminal 222, an output terminal 223, and an output reference terminal 224.

To the input terminal 221, part of the first input signal, which is a signal to be rectified, is input with reference to the input reference terminal 222.

From the output terminal 223, a rectified signal is output with reference to the output reference terminal 224.

The first signal input terminal 111 is connected to the input terminal 211 of the first rectifying unit 210 and the input terminal 221 of the second rectifying unit 220.

The first signal input reference terminal 112 is connected to the input reference terminal 212 of the first rectifying unit 210 and the input reference terminal 222 of the second rectifying unit 220.

The output terminal 213 of the first rectifying unit 210 is connected with the charging voltage output terminal 113.

The output reference terminal 214 of the first rectifying unit 210 is connected with the charging voltage output reference terminal 114.

The output terminal 223 of the second rectifying unit 220 is connected with the conduction control terminal (for example, the gate terminal) of the first switching element S1 at a fifth connection point a5 (e.g., fifth node).

The output reference terminal 224 of the second rectifying unit 220 is connected with the second connection point a2.

The second connection point a2 and the fifth connection point a5 are connected with each other.

In the second embodiment, the first input signal may include a first signal having a first amplitude and a second signal having a second amplitude.

The first amplitude is an amplitude greater than the second amplitude.

A voltage for charging the charge storage element Ca may be generated by rectification of part of the first signal in the first rectifying unit 210.

A voltage which places the first switching element S1 into the off-state may be generated by rectification of part of the first signal in the second rectifying unit 220.

In the signal generation circuit 1100 according to the second embodiment, the output voltage generating unit 120 includes a third rectifying unit 230 and a fourth rectifying unit 240.

The third rectifying unit 230 includes an input terminal 231, an input reference terminal 232, an output terminal 233, and an output reference terminal 234.

To the input terminal 231, part of the second input signal, which is a signal to be rectified, is input with reference to the input reference terminal 232.

From the output terminal 233, a rectified signal is output with reference to the output reference terminal 234.

The fourth rectifying unit 240 includes an input terminal 241, an input reference terminal 242, an output terminal 243, and an output reference terminal 244.

To the input terminal 241, part of the second input signal, which is a signal to be rectified, is input with reference to the input reference terminal 242.

From the output terminal 243, a rectified signal is output with reference to the output reference terminal 244.

The second signal input terminal 121 is connected with the input terminal 231 of the third rectifying unit 230 and the input terminal 241 of the fourth rectifying unit 240.

The second signal input reference terminal 122 is connected with the input reference terminal 232 of the third rectifying unit 230 and the input reference terminal 242 of the fourth rectifying unit 240.

The output terminal 233 of the third rectifying unit 230 is connected with the output-voltage output terminal 123.

The output reference terminal 234 of the third rectifying unit 230 is connected with the output-voltage output reference terminal 124.

The output terminal 243 of the fourth rectifying unit 240 is connected with the conduction control terminal (for example, the gate terminal) of the second switching element S2 at a sixth connection point a6 (e.g., sixth node).

The output reference terminal 244 of the fourth rectifying unit 240 is connected with the fourth connection point a4.

The fourth connection point a4 and the sixth connection point a6 are connected with each other.

In the second embodiment, the first input signal may include a first signal having a first amplitude and a second signal having a second amplitude, and the second input signal may include a third signal having a third amplitude and a fourth signal having a fourth amplitude.

The fourth amplitude is an amplitude greater than the third amplitude.

A voltage to be output from the signal output terminal 303 may be generated by rectification of part of the fourth signal in the third rectifying unit 230.

A voltage which places the second switching element S2 into the off-state may be generated by rectification of part of the fourth signal in the fourth rectifying unit 240.

For the first rectifying unit 210, the second rectifying unit 220, the third rectifying unit 230, and the fourth rectifying unit 240 in the second embodiment, single-shunt rectifier circuits, half-wave rectifier circuits, full-wave rectifier circuits, voltage doubler rectifier circuits, single-series rectifier circuits, rectifier circuits using transistors, and the like may be employed, for example.

Figure 5:
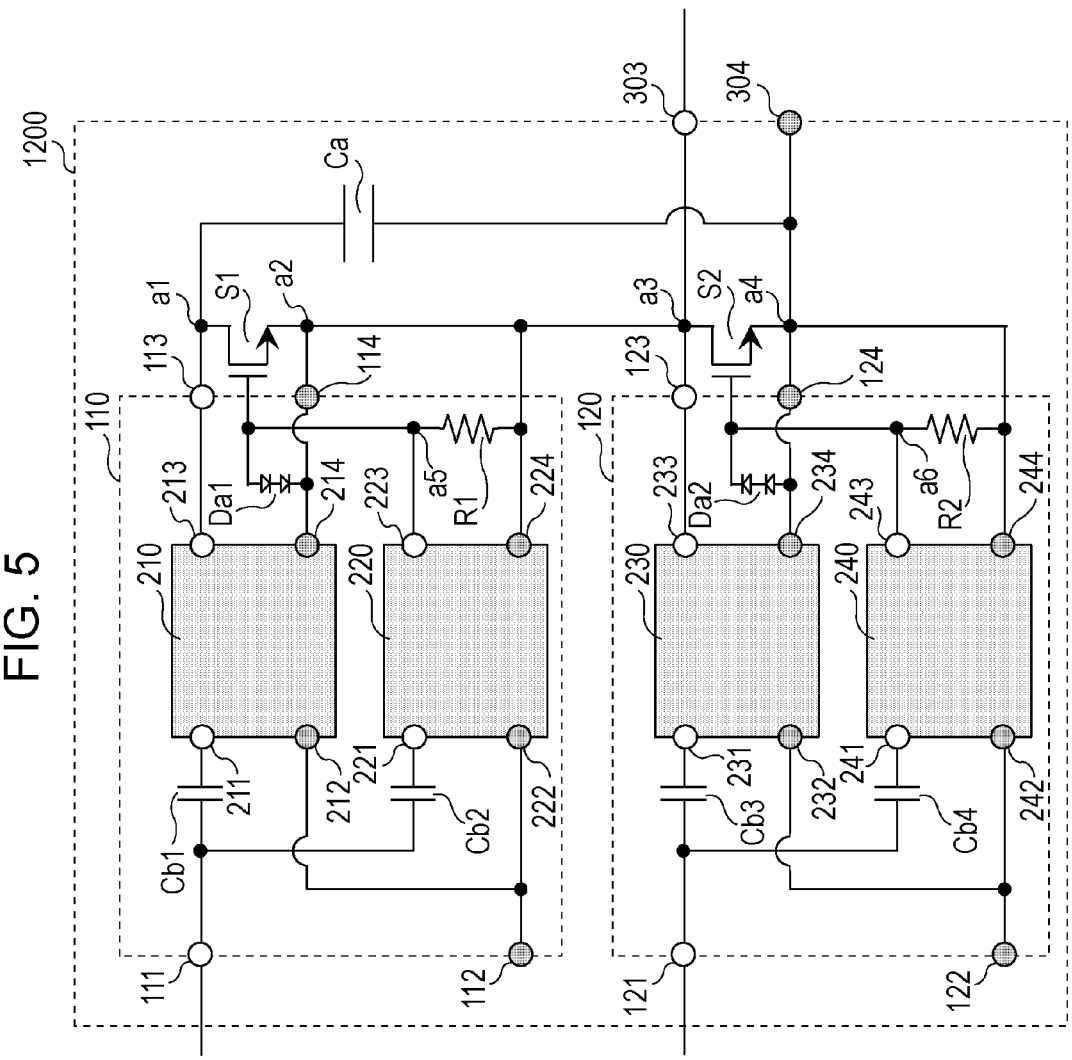
FIG. 5 is a circuit diagram schematically showing the configuration of a signal generation circuit 1200 as a variation of the second embodiment.

FIG. 5 is a circuit diagram schematically showing the configuration of a signal generation circuit 1200 as a variation of the second embodiment.

As shown in FIG. 5, the signal generation circuit in the second embodiment may include a first resistance element R1.

In such an implementation, the first resistance element R1 is connected between the second connection point a2 and the fifth connection point a5.

With this configuration, by adjusting the resistance value of the first resistance element R1, the speed of making the first switching element S1 transition from the off-state to the on-state can be adjusted. For example, by decreasing the resistance value of the first resistance element R1, the speed of making the first switching element S1 transition from the off-state to the on-state can be increased.

The signal generation circuit in the second embodiment may also include a circuit which places the first switching element S1 into the on-state in the normal status in place of the first resistance element R1.

Also, as shown in FIG. 5, the signal generation circuit in the second embodiment may include a capacitor Cb1 and a capacitor Cb2.

In such an implementation, the capacitor Cb1 is connected between the first signal input terminal 111 and the input terminal 211 of the first rectifying unit 210.

The capacitor Cb2 is connected between the first signal input terminal 111 and the input terminal 221 of the second rectifying unit 220.

The capacitance of the capacitor Cb1 may differ from the capacitance of the capacitor Cb2.

With this configuration, it is possible to adjust the ratio of electric power allocated between the first rectifying unit 210 and the second rectifying unit 220, of the electric power present in the first input signal input to the first signal input terminal 111. Thus, the magnitude of the voltage for charging the charge storage element Ca and the magnitude of the voltage for placing the first switching element S1 into the off-state can be adjusted.

The signal generation circuit in the second embodiment may also include only either one of the capacitor CM and the capacitor Cb2.

Alternatively, the signal generation circuit in the second embodiment may include a circuit capable of separating the voltages input to the first rectifying unit 210 and the second rectifying unit 220 from each other in place of the capacitor CM and the capacitor Cb2.

Also, as shown in FIG. 5, the signal generation circuit in the second embodiment may include a diode Da1 (for example, a clipping diode).

In such an implementation, the diode Da1 is connected between the second connection point a2 and the conduction control terminal of the first switching element S1.

With this configuration, when a positive voltage output at the output terminal 233 of the third rectifying unit 230 is applied to the source terminal of the first switching element S1, the gate voltage of the first switching element S1 can be kept from being lower than the voltage of the first switching element S1.

The anode of the diode Da1 may be connected to the conduction control terminal of the first switching element S1.

The diode Da1 may be formed of multiple diodes connected in series.

Also, as shown in FIG. 5, the signal generation circuit in the second embodiment may include a second resistance element R2.

In such an implementation, the second resistance element R2 is connected between the fourth connection point a4 and the sixth connection point a6.

With this configuration, by adjusting the resistance value of the second resistance element R2, the speed of making the second switching element S2 transition from the off-state to the on-state can be adjusted. For example, by decreasing the resistance value of the second resistance element R2, the speed of making the second switching element S2 transition from the off-state to the on-state can be increased.

The signal generation circuit in the second embodiment may include a circuit which places the second switching element S2 into the on-state in the normal status in place of the second resistance element R2.

Also, as shown in FIG. 5, the signal generation circuit in the second embodiment may include a capacitor Cb3 and a capacitor Cb4.

In such an implementation, the capacitor Cb3 is connected between the second signal input terminal 121 and the input terminal 231 of the third rectifying unit 230.

The capacitor Cb4 is connected between the second signal input terminal 121 and the input terminal 241 of the fourth rectifying unit 240.

The capacitance of the capacitor Cb3 may differ from the capacitance of the capacitor Cb4.

With this configuration, it is possible to adjust the ratio of electric power allocated between the third rectifying unit 230 and the fourth rectifying unit 240, of the electric power present in the second input signal input to the second signal input terminal 121. Thus, the magnitude of the voltage output from the signal output terminal 303 and the magnitude of the voltage for placing the second switching element S2 into the off-state can be adjusted.

The signal generation circuit in the second embodiment may also include only either one of the capacitor Cb3 and the capacitor Cb4.

Alternatively, the signal generation circuit in the second embodiment may include a circuit capable of separating the voltages input to the third rectifying unit 230 and the fourth rectifying unit 240 from each other in place of the capacitor Cb3 and the capacitor Cb4.

Also, as shown in FIG. 5, the signal generation circuit in the second embodiment may include a diode Da2 (for example, a clipping diode).

In such an implementation, the diode Da2 is connected between the fourth connection point a4 and the conduction control terminal of the second switching element S2.

With this configuration, it is possible to prevent application of an excessively large negative voltage to the second switching element S2 as the output from the output terminal 243 of the fourth rectifying unit 240. This can prevent a reduction in the speed of the second switching element S2 transitioning from the off-state to the on-state which is caused by application of an excessively large negative voltage.

The cathode of the diode Da2 may be connected with the conduction control terminal of the second switching element S2.

The diode Da2 may be formed of multiple diodes connected in series.

Note that some of the configurations described in the second embodiment may be selectively used as the configuration of the signal generation circuit in the first embodiment as appropriate.

Third Embodiment

A third embodiment of the present disclosure will be described as a specific example of the configuration of the second embodiment. The descriptions common to the second embodiment described above will be omitted appropriately.

Figure 6:
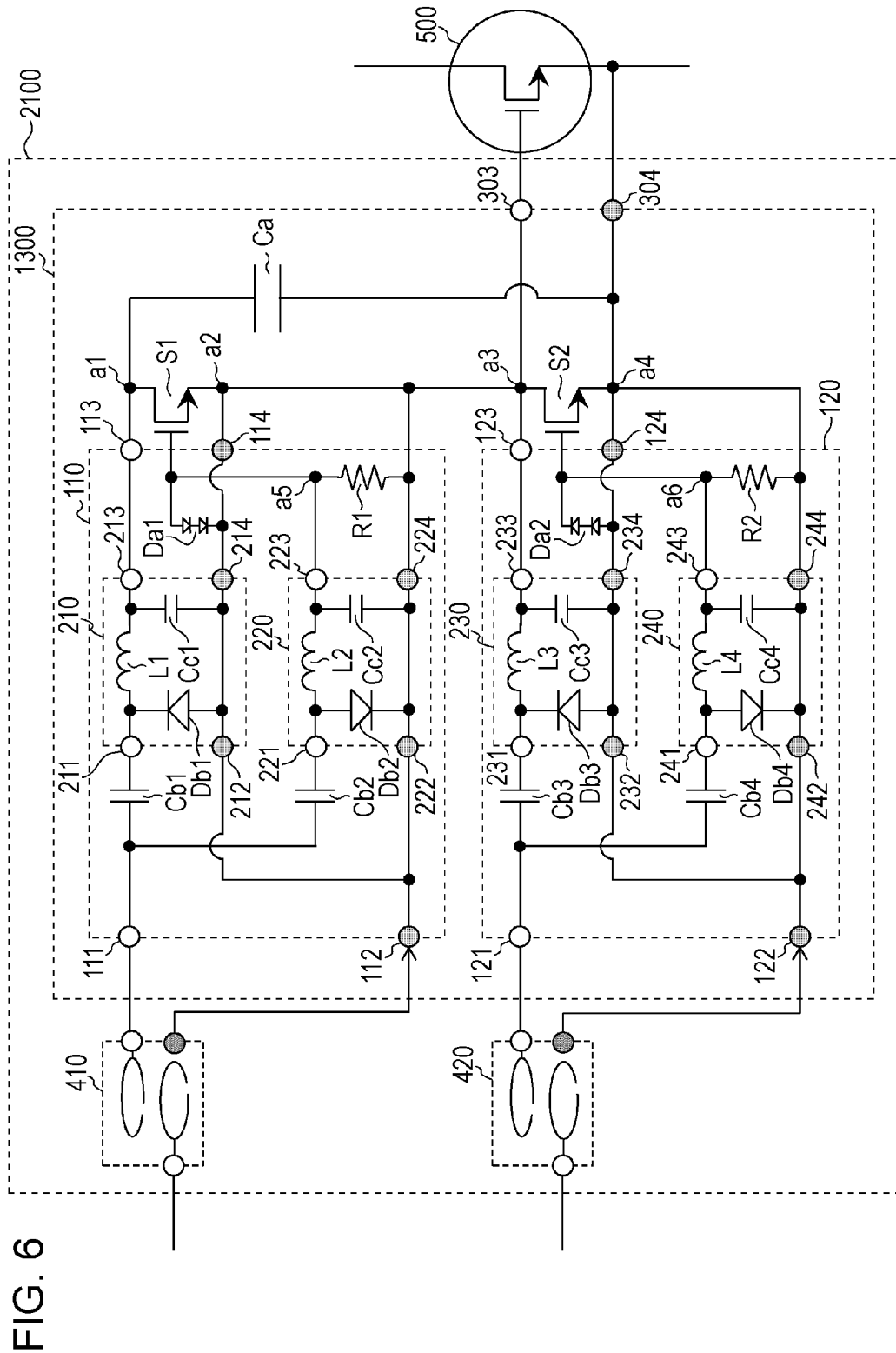
FIG. 6 is a circuit diagram schematically showing the configuration of the signal generation circuit according to a third embodiment.

FIG. 6 is a circuit diagram schematically showing the configuration of the signal generation circuit according to the third embodiment.

In a signal generation circuit 1300 according to the third embodiment, the first switching element is a normally-on transistor.

Then, a positive voltage referenced to the output reference terminal 214 of the first rectifying unit 210 is output from the output terminal 213 of the first rectifying unit 210.

Also, a negative voltage referenced to the output reference terminal 224 of the second rectifying unit 220 is output from the output terminal 223 of the second rectifying unit 220.

In a more specific example, in the signal generation circuit 1300 according to the third embodiment, the first rectifying unit 210 includes an inductor L1, a capacitor Cc1, and a diode Db1.

The input reference terminal 212 of the first rectifying unit 210 is connected with the output reference terminal 214 of the first rectifying unit 210.

The inductor L1 is connected between the input terminal 211 of the first rectifying unit 210 and the output terminal 213 of the first rectifying unit 210.

A first terminal of the capacitor Cc1 is connected to a path that connects between the inductor L1 and the output terminal 213 of the first rectifying unit 210.

A second terminal of the capacitor Cc1 is connected with the output reference terminal 214 of the first rectifying unit 210.

The cathode of the diode Db1 is connected to a path that connects between the inductor L1 and the input terminal 211 of the first rectifying unit 210.

The anode of the diode Db1 is connected with the input reference terminal 212 of the first rectifying unit 210.

In a more specific example, in the signal generation circuit 1300 according to the third embodiment, the second rectifying unit 220 includes an inductor L2, a capacitor Cc2, and a diode Db2.

The input reference terminal 222 of the second rectifying unit 220 is connected with the output reference terminal 224 of the second rectifying unit 220.

The inductor L2 is connected between the input terminal 221 of the second rectifying unit 220 and the output terminal 223 of the second rectifying unit 220.

A first terminal of the capacitor Cc2 is connected to a path that connects between the inductor L2 and the output terminal 223 of the second rectifying unit 220.

A second terminal of the capacitor Cc2 is connected with the output reference terminal 224 of the second rectifying unit 220.

The anode of the diode Db2 is connected to a path that connects between the inductor L2 and the input terminal 221 of the second rectifying unit 220.

The cathode of the diode Db2 is connected with the input reference terminal 222 of the second rectifying unit 220.

In the signal generation circuit 1300 according to the third embodiment, the second switching element S2 is a normally-on transistor.

Then, a positive voltage referenced to the output reference terminal 234 of the third rectifying unit 230 is output from the output terminal 233 of the third rectifying unit 230.

A negative voltage referenced to the output reference terminal 244 of the fourth rectifying unit 240 is output from the output terminal 243 of the fourth rectifying unit 240.

In a more specific example, in the signal generation circuit 1300 according to the third embodiment, the third rectifying unit 230 includes an inductor L3, a capacitor Cc3, and a diode Db3.

The input reference terminal 232 of the third rectifying unit 230 is connected with the output reference terminal 234 of the third rectifying unit 230.

The inductor L3 is connected between the input terminal 231 of the third rectifying unit 230 and the output terminal 233 of the third rectifying unit 230.

A first terminal of the capacitor Cc3 is connected to a path that connects between the inductor L3 and the output terminal 233 of the third rectifying unit 230.

A second terminal of the capacitor Cc3 is connected to the output reference terminal 234 of the third rectifying unit 230.

The cathode of the diode Db3 is connected to a path that connects between the inductor L3 and the input terminal 231 of the third rectifying unit 230.

The anode of the diode Db3 is connected to the input reference terminal 232 of the third rectifying unit 230.

In a more specific example, in the signal generation circuit 1300 according to the third embodiment, the fourth rectifying unit 240 includes an inductor L4, a capacitor Cc4, and a diode Db4.

The input reference terminal 242 of the fourth rectifying unit 240 is connected with the output reference terminal 244 of the fourth rectifying unit 240.

The inductor L4 is connected between the input terminal 241 of the fourth rectifying unit 240 and the output terminal 243 of the fourth rectifying unit 240.

A first terminal of the capacitor Cc4 is connected to a path that connects between the inductor L4 and the output terminal 243 of the fourth rectifying unit 240.

A second terminal of the capacitor Cc4 is connected with the output reference terminal 244 of the fourth rectifying unit 240.

The anode of the diode Db4 is connected to a path that connects between the inductor L4 and the input terminal 241 of the fourth rectifying unit 240.

The cathode of the diode Db4 is connected with the input reference terminal 242 of the fourth rectifying unit 240.

As described, in the signal generation circuit 1300 according to the third embodiment, the first rectifying unit 210, the second rectifying unit 220, the third rectifying unit 230, and the fourth rectifying unit 240 are single-shunt rectifier circuits.

The diodes Db1, Db2, Db3, and Db4 may be Schottky barrier diodes using a nitride semiconductor, for example.

The diodes Db1, Db2, Db3, and Db4 may be diodes operating at high frequency and having different characteristics from each other.

FIG. 6 schematically illustrates the configuration of a signal generation circuit 2100 in the third embodiment.

The signal generation circuit 2100 in the third embodiment further includes a first electromagnetic field resonance coupler, or a first insulating element 410, and a second electromagnetic field resonance coupler, or a second insulating element 420, in addition to the components of the signal generation circuit 1300 described above.

Taking the signal generation circuit 2100 thus configured as a specific example, an exemplary operation of the signal generation circuit will now be described.

The exemplary operation described below illustrates a case where the switching element 500 is driven by the output signal of the signal generation circuit 2100 as shown in FIG. 6.

In the exemplary operation described below, both the high frequency signals input to the first electromagnetic field resonance coupler and the second electromagnetic field resonance coupler are signals generated by amplitude modulation of a high frequency wave of 2.4 GHz as an example.

Here, the high frequency signals input to the first electromagnetic field resonance coupler and the second electromagnetic field resonance coupler yield an output signal strength of +20 dBm during the output phase (that is, on).

The high frequency signals input to the first electromagnetic field resonance coupler and the second electromagnetic field resonance coupler yield an output signal strength of −10 dBm during the non-output phase (that is, off).

During a time period in which the high frequency signal is input to the first electromagnetic field resonance coupler, no high frequency signal is input to the second electromagnetic field resonance coupler.

With these conditions, a high frequency signal transmitted with electrical isolation via the first electromagnetic field resonance coupler is formed into such a first input signal as shown in FIG. 2.

Likewise, a high frequency signal transmitted with electrical isolation via the second electromagnetic field resonance coupler is formed into such a second input signal as shown in FIG. 2.

The high frequency signals input to the first and second electromagnetic field resonance couplers may be signals generated by amplitude modulation of high frequency waves having different frequencies.

In the following, exemplary operations in the time periods T1, T2, and T3 in FIG. 2 will be shown.

<Time Period T1>

To the first signal input terminal 111, a first input signal referenced to the first signal input reference terminal 112 is input.

This causes the first input signal to be input to the input terminal 221 of the second rectifying unit 220.

The second rectifying unit 220 rectifies the first input signal input to it.

As a result, a negative voltage referenced to the output reference terminal 224 of the second rectifying unit 220 is output from the output terminal 223 of the second rectifying unit 220.

The negative voltage output from the output terminal 223 of the second rectifying unit 220 is applied to the conduction control terminal of the first switching element S1.

This brings the first switching element S1 into the off-state, meaning that the drain and the source of the first switching element S1 are disconnected from each other.

Meanwhile, the second input signal is not being input to the second signal input terminal 121.

Thus, no negative voltage is output from the output terminal 243 of the fourth rectifying unit 240.

The conduction control terminal of the second switching element S2 is connected with the source terminal of the second switching element S2.

Accordingly, the second switching element S2 is in the on-state.

The first input signal is input to the input terminal 211 of the first rectifying unit 210.

The first rectifying unit 210 rectifies the first input signal input to it.

As a result, a positive voltage referenced to the output reference terminal 214 of the first rectifying unit 210 is output from the output terminal 213 of the first rectifying unit 210.

As mentioned above, the first switching element S1 is in the off-state and the second switching element S2 is in the on-state.

Consequently, the positive voltage output from the output terminal 213 of the first rectifying unit 210 causes electric charge to be stored in the charge storage element Ca.

The reference point of the charge storage element Ca is the signal output reference terminal 304.

The reference point of the first switching element S1 is the output reference terminal 214 of the first rectifying unit 210.

As described above, the signal output reference terminal 304 and the output reference terminal 214 of the first rectifying unit 210 can be connected to each other by placing the second switching element S2 into the on-state, so that the different reference points can be reduced into a common reference point.

Therefore, storage of electric charge into the charge storage element Ca and feeding of the gate voltage to the first switching element S1 can be performed simultaneously.

There is continuity between the signal output terminal 303 and the signal output reference terminal 304.

Thus, no output signal referenced to the signal output reference terminal 304 is generated at the signal output terminal 303.

In other words, the driving signal for the power semiconductor device 500 is not being generated, so the power semiconductor device 500 turns off. Continuity exists between the gate terminal and the source terminal of the power semiconductor device 500.

<Time Period T2>

To the second signal input terminal 121, a second input signal referenced to the second signal input reference terminal 122 is input.

This causes the second input signal to be input to the input terminal 241 of the fourth rectifying unit 240.

The fourth rectifying unit 240 rectifies the second input signal input to it.

As a result, a negative voltage referenced to the output reference terminal 244 of the fourth rectifying unit 240 is output from the output terminal 243 of the fourth rectifying unit 240.

The negative voltage output from the output terminal 243 of the fourth rectifying unit 240 is applied to the conduction control terminal of the second switching element S2.

This brings the second switching element S2 into the off-state, meaning that the drain and the source of the second switching element S2 are disconnected from each other.

This results in a state in which the signal output terminal 303 and the signal output reference terminal 304 are not connected to each other.

Meanwhile, the first input signal is not being input to the first signal input terminal 111.

Thus, no negative voltage is output from the output terminal 223 of the second rectifying unit 220.

The conduction control terminal of the first switching element S1 is connected with the source terminal of the first switching element S1.

Accordingly, the first switching element S1 is in the on-state.

As described, the first switching element S1 is in the on-state and the second switching element S2 is in the off-state.

Consequently, the first terminal of the charge storage element Ca and the signal output terminal 303 become electrically continuous to each other.

Further, the second terminal of the charge storage element Ca and the signal output reference terminal 304 become electrically continuous to each other.

Then, the electric charge stored in the charge storage element Ca is output from the signal output terminal 303.

As described above, at the instant the second input signal is input to the second signal input terminal 121, the first switching element S1 transitions to the off-state, upon which the electric charge stored in the charge storage element Ca is supplied to the signal output terminal 303.

Thus, a large gate peak current can be supplied to the gate terminal of the power semiconductor device 500 at the moment the power semiconductor device 500 is turned on.

Also, the second input signal is input to the input terminal 231 of the third rectifying unit 230.

The third rectifying unit 230 rectifies the second input signal input to it.

As a result, a positive voltage referenced to the output reference terminal 234 of the third rectifying unit 230 is output from the output terminal 233 of the third rectifying unit 230.

The output terminal 233 of the third rectifying unit 230 is connected with the signal output terminal 303.

The second switching element S2 is in the off-state.

Accordingly, the positive voltage output from the output terminal 233 of the third rectifying unit 230 is applied to the signal output terminal 303.

As a consequence, the positive voltage output from the output terminal 233 of the third rectifying unit 230 is output from the signal output terminal 303 as output signal even after all of the electric charge stored in the charge storage element Ca is supplied.

Therefore, voltage for maintaining the power semiconductor device 500 in the on-state can be supplied to the gate terminal of the power semiconductor device 500.

<Time Period T3>

Input of the second input signal to the second signal input terminal 121 ceases.

A negative voltage is then no longer output from the output terminal 243 of the fourth rectifying unit 240.

The conduction control terminal of the second switching element S2 is connected with the source terminal of the second switching element S2.

Accordingly, the second switching element S2 transitions to the on-state.

In this state, continuity exists between the signal output terminal 303 and signal output reference terminal 304.

Thus, an output signal referenced to the signal output reference terminal 304 is no longer generated at the signal output terminal 303.

In this state, the gate terminal and the source terminal of the power semiconductor device 500 become short-circuited.

The power semiconductor device 500 can therefore be placed into the off-state abruptly.

If a large negative voltage generated in the third rectifying unit 230 is being applied to the conduction control terminal of the second switching element S2, the time at which the second switching element S2 turns on would be delayed. Thus, by providing the diode Da2, application of an excessive negative voltage is avoided. In this exemplary operation, a diode with a threshold of 4 V was employed as the diode Da2.

Figure 7:
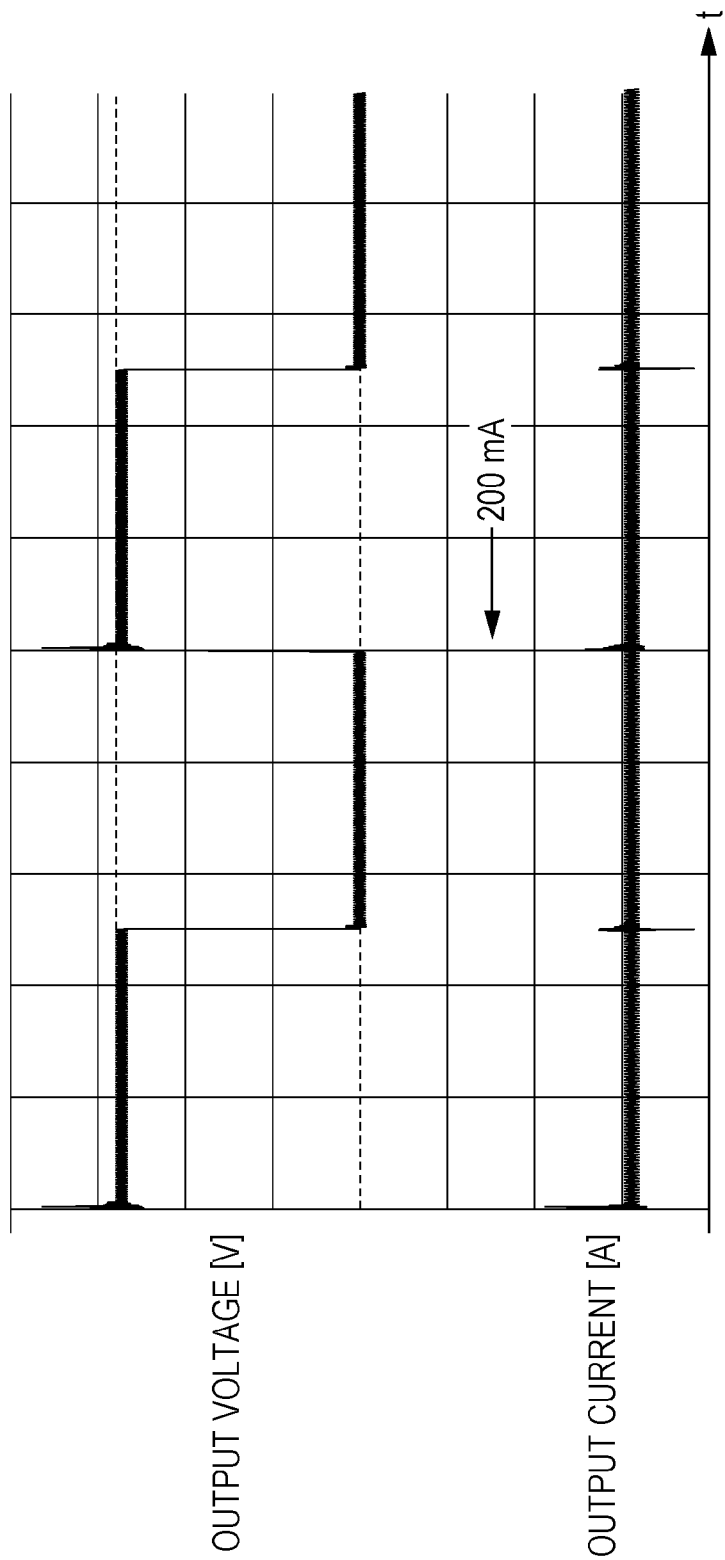
FIG. 7 is a diagram illustrating the output voltage and output current of the signal generation circuit in the third embodiment.

FIG. 7 is a diagram illustrating the output voltage and output current of the signal generation circuit in the third embodiment.

Figure 8:
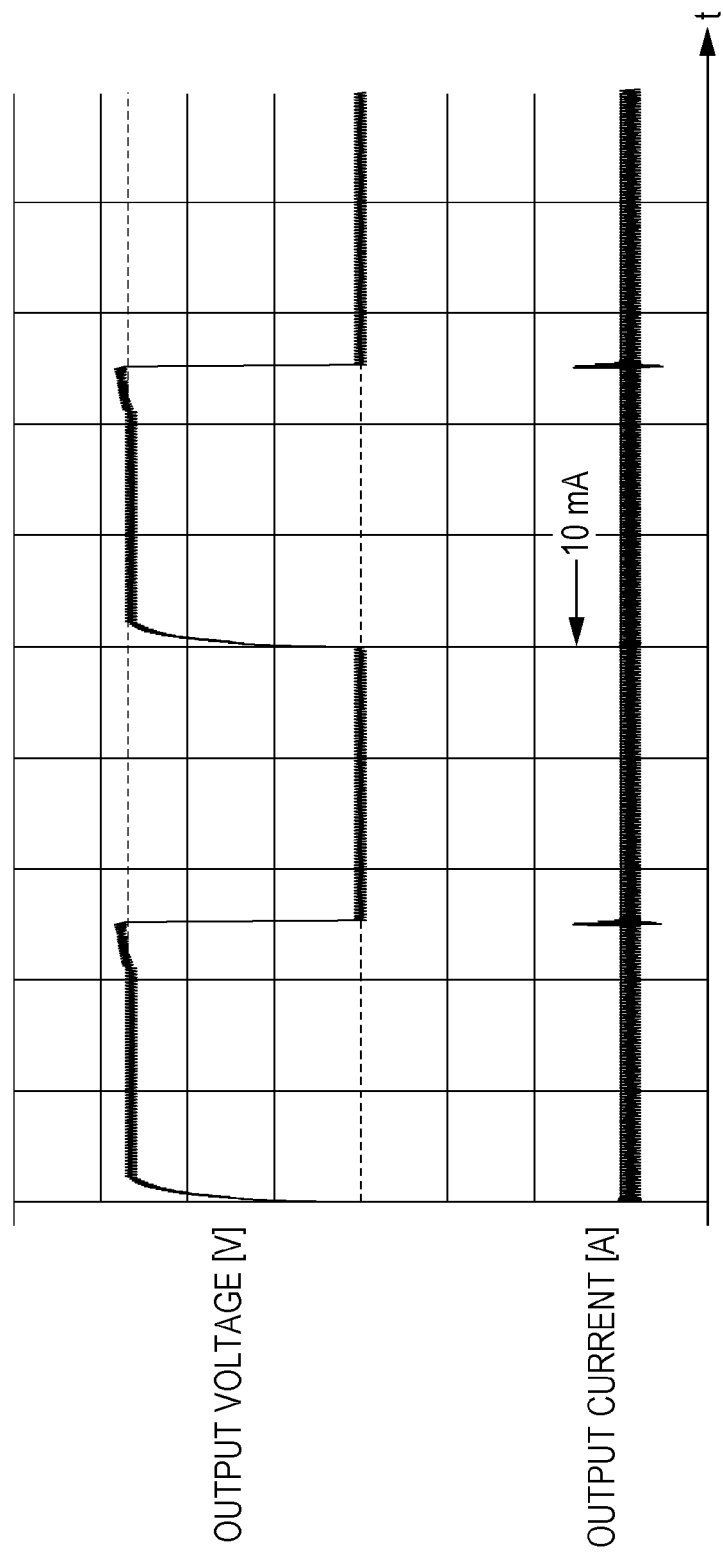
FIG. 8 is a diagram illustrating the output voltage and output current of a signal generation circuit as a comparative example.

FIG. 8 is a diagram illustrating the output voltage and output current of a signal generation circuit as a comparative example.

As the comparative example, a generally known half-bridge circuit was used, meaning that unlike the embodiments of the present disclosure, the comparative example does not include a charging voltage generating unit, an output voltage generating unit, and a charge storage element.

As can be seen from FIG. 7, the signal generation circuit according to the third embodiment is able to supply a large gate peak current to the gate of the power semiconductor device at the turning on of switching.

That is, an electric charge can be rapidly applied to the gate of the power semiconductor device, thus enabling rapid raising of the gate voltage. The rapid raising of the gate voltage can significantly reduce switching loss. Moreover, since the gate voltage can be rapidly raised, fast switching can be achieved as well. In addition, a stable gate voltage can be supplied while the power semiconductor device is in the on-state.

As discussed above, the third embodiment can provide a gate driving circuit capable of supplying a large gate peak current using two resonance couplers, that is, the first and second electromagnetic field resonance couplers. Because it can be composed of two resonance couplers, the gate driving circuit can be of a reduced size and also produced at low costs. Since the third embodiment can supply a large gate peak current, the power semiconductor device can be rapidly turned on, so that both low-loss and fast switching can be achieved. In addition, the ability to supply a large gate peak current enables driving of a large power semiconductor switch that has a large gate capacitance and switches a large current with low loss.

Additionally, the signal generation circuit in the third embodiment permits adjustment of the gate peak current during its rise through adjustment of the strength of the first input signal.

The signal generation circuit in the third embodiment also permits adjustment of the magnitude of the gate voltage being output during the on-state through adjustment of the strength of the second input signal.

Note that some of the configurations described in the third embodiment may be selectively used as the configuration of the signal generation circuit in the first or second embodiment as appropriate.

It should be noted that in the first to third embodiments described above, connection between two elements (for example, one element being connected with another element) may refer to not only direct connection but electrical connection as well as connection in which another element (for example, wiring, a resistance element, or the like that does not compromise the functionality of the embodiments) is interposed between the two elements.

The present disclosure is applicable to a power converter or a power system, for example.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A signal generation circuit comprising:
   a charging voltage generating unit;
   an output voltage generating unit;
   a first switching element;
   a second switching element;
   a charge storage element;
   a signal output terminal; and
   a signal output reference terminal, wherein
   the charging voltage generating unit includes a first signal input terminal, a first signal input reference terminal, a charging voltage output terminal, and a charging voltage output reference terminal,
   the output voltage generating unit includes a second signal input terminal, a second signal input reference terminal, an output-voltage output terminal, and an output-voltage output reference terminal,
   the first signal input terminal is a terminal to which a first input signal which is referenced to the first signal input reference terminal is input,
   the second signal input terminal is a terminal to which a second input signal which is referenced to the second signal input reference terminal is input,
   the charging voltage generating unit generates a voltage which charges the charge storage element from the first input signal,
   the output voltage generating unit generates a voltage which is referenced to the signal output reference terminal and which is output at the signal output terminal from the second input signal, the charging voltage output terminal is connected with a first terminal of the first switching element at a first connection point, the charging voltage output reference terminal is connected with a second terminal of the first switching element at a second connection point, the output-voltage output terminal is connected with a first terminal of the second switching element at a third connection point, the output-voltage output reference terminal is connected with a second terminal of the second switching element at a fourth connection point, the third connection point is connected with the signal output terminal, the fourth connection point is connected with the signal output reference terminal, the second connection point and the third connection point are connected to each other, a first terminal of the charge storage element is connected with the first connection point, and a second terminal of the charge storage element is connected with the fourth connection point.

2. The signal generation circuit according to claim 1, wherein the charging voltage generating unit generates a voltage which places the first switching element into an off-state from the first input signal and outputs the voltage to a conduction control terminal of the first switching element, and the output voltage generating unit generates a voltage which places the second switching element into the off-state from the second input signal and outputs the voltage to the conduction control terminal of the second switching element.

3. The signal generation circuit according to claim 2, wherein the first input signal includes a first signal having a first amplitude and a second signal having a second amplitude, the first amplitude is an amplitude greater than the second amplitude, the second input signal includes a third signal having a third amplitude and a fourth signal having a fourth amplitude, the fourth amplitude is an amplitude greater than the third amplitude, the charging voltage generating unit generates a voltage which charges the charge storage element from the first signal, the charging voltage generating unit generates a voltage which places the first switching element into the off-state from the first signal and outputs the voltage to the conduction control terminal of the first switching element, the output voltage generating unit generates a voltage to be output at the signal output terminal from the fourth signal, the output voltage generating unit generates a voltage which places the second switching element into the off-state from the fourth signal and outputs the voltage to the conduction control terminal of the second switching element, a part of a time period during which the first signal is input to the first signal input terminal and a part of a time period during which the third signal is input to the second signal input terminal overlap, and a part of a time period during which the second signal is input to the first signal input terminal and a part of a time period during which the fourth signal is input to the second signal input terminal overlap.

4. The signal generation circuit according to claim 1, wherein the charging voltage generating unit includes a first rectifying unit and a second rectifying unit, the first rectifying unit includes an input terminal to which a signal to be rectified is input, an input reference terminal, an output terminal from which a rectified signal is output, and an output reference terminal, the second rectifying unit includes an input terminal to which a signal to be rectified is input, an input reference terminal, an output terminal from which a rectified signal is output, and an output reference terminal, the first signal input terminal is connected to the input terminal of the first rectifying unit and the input terminal of the second rectifying unit, the first signal input reference terminal is connected to the input reference terminal of the first rectifying unit and the input reference terminal of the second rectifying unit, the output terminal of the first rectifying unit is connected with the charging voltage output terminal, the output reference terminal of the first rectifying unit is connected with the charging voltage output reference terminal, the output terminal of the second rectifying unit is connected with the conduction control terminal of the first switching element at a fifth connection point, the output reference terminal of the second rectifying unit is connected with the second connection point, and the second connection point and the fifth connection point are connected with each other.

5. The signal generation circuit according to claim 4, wherein the first input signal includes a first signal having a first amplitude and a second signal having a second amplitude, the first amplitude is an amplitude greater than the second amplitude, a voltage which charges the charge storage element is generated by rectification of part of the first signal in the first rectifying unit, and a voltage which places the first switching element into the off-state is generated by rectification of part of the first signal in the second rectifying unit.

6. The signal generation circuit according to claim 4, further comprising:

a first resistance element, wherein the first resistance element is connected between the second connection point and the fifth connection point.

7. The signal generation circuit according to claim 4, further comprising:

a capacitor Cb1; and a capacitor Cb2, wherein the capacitor Cb1 is connected between the first signal input terminal and the input terminal of the first rectifying unit, the capacitor Cb2 is connected between the first signal input terminal and the input terminal of the second rectifying unit, and a capacitance of the capacitor Cb1 differs from a capacitance of the capacitor Cb2.

8. The signal generation circuit according to claim 4, further comprising:

a diode Da1, wherein
the diode Da1 is connected between the second connection point and the conduction control terminal of the first switching element.

9. The signal generation circuit according to claim 4, wherein
the first switching element is a normally-on transistor,
a positive voltage referenced to the output reference terminal of the first rectifying unit is output from the output terminal of the first rectifying unit, and
a negative voltage referenced to the output reference terminal of the second rectifying unit is output from the output terminal of the second rectifying unit.

10. The signal generation circuit according to claim 9, wherein
the first rectifying unit includes an inductor L1, a capacitor Cc1, and a diode Db1,
the input reference terminal of the first rectifying unit is connected with the output reference terminal of the first rectifying unit,
the inductor L1 is connected between the input terminal of the first rectifying unit and the output terminal of the first rectifying unit,
a first terminal of the capacitor Cc1 is connected to a path that connects between the inductor L1 and the output terminal of the first rectifying unit,
a second terminal of the capacitor Cc1 is connected with the output reference terminal of the first rectifying unit,
a cathode of the diode Db1 is connected to a path that connects between the inductor L1 and the input terminal of the first rectifying unit,
an anode of the diode Db1 is connected with the input reference terminal of the first rectifying unit,
the second rectifying unit includes an inductor L2, a capacitor Cc2, and a diode Db2,
the input reference terminal of the second rectifying unit is connected with the output reference terminal of the second rectifying unit,
the inductor L2 is connected between the input terminal of the second rectifying unit and the output terminal of the second rectifying unit,
a first terminal of the capacitor Cc2 is connected to a path that connects between the inductor L2 and the output terminal of the second rectifying unit,
a second terminal of the capacitor Cc2 is connected with the output reference terminal of the second rectifying unit,
an anode of the diode Db2 is connected to a path that connects between the inductor L2 and the input terminal of the second rectifying unit, and
a cathode of the diode Db2 is connected with the input reference terminal of the second rectifying unit.

11. The signal generation circuit according to claim 1, wherein
the output voltage generating unit includes a third rectifying unit and a fourth rectifying unit,
the third rectifying unit includes an input terminal to which a signal to be rectified is input, an input reference terminal, an output terminal from which a rectified signal is output, and an output reference terminal,
the fourth rectifying unit includes an input terminal to which a signal to be rectified is input, an input reference terminal, an output terminal from which a rectified signal is output, and an output reference terminal,
the second signal input terminal is connected with the input terminal of the third rectifying unit and the input terminal of the fourth rectifying unit,
the second signal input reference terminal is connected with the input reference terminal of the third rectifying unit and the input reference terminal of the fourth rectifying unit,
the output terminal of the third rectifying unit is connected with the output-voltage output terminal,
the output reference terminal of the third rectifying unit is connected with the output-voltage output reference terminal,
the output terminal of the fourth rectifying unit is connected with the conduction control terminal of the second switching element at a sixth connection point,
the output reference terminal of the fourth rectifying unit is connected with the fourth connection point, and
the fourth connection point and the sixth connection point are connected with each other.

12. The signal generation circuit according to claim 11, wherein
the second input signal includes a third signal having a third amplitude and a fourth signal having a fourth amplitude,
the fourth amplitude is an amplitude greater than the third amplitude,
a voltage to be output from the signal output terminal is generated by rectification of part of the fourth signal in the third rectifying unit, and
a voltage which places the second switching element into the off-state is generated by rectification of part of the fourth signal in the fourth rectifying unit.

13. The signal generation circuit according to claim 11, further comprising:
a second resistance element, wherein
the second resistance element is connected between the fourth connection point and the sixth connection point.

14. The signal generation circuit according to claim 11, further comprising:
a capacitor Cb3; and
a capacitor Cb4, wherein
the capacitor Cb3 is connected between the second signal input terminal and the input terminal of the third rectifying unit,
the capacitor Cb4 is connected between the second signal input terminal and the input terminal of the fourth rectifying unit, and
the capacitance of the capacitor Cb3 differs from the capacitance of the capacitor Cb4.

15. The signal generation circuit according to claim 11, further comprising:
a diode Da2, wherein
the diode Da2 is connected between the fourth connection point and a conduction control terminal of the second switching element.

16. The signal generation circuit according to claim 11, wherein
the second switching element is a normally-on transistor,
a positive voltage referenced to the output reference terminal of the third rectifying unit is output from the output terminal of the third rectifying unit, and
a negative voltage referenced to the output reference terminal of the fourth rectifying unit is output from the output terminal of the fourth rectifying unit.

17. The signal generation circuit according to claim 16, wherein
the third rectifying unit includes an inductor L3, a capacitor Cc3, and a diode Db3, the input reference terminal of the third rectifying unit is connected with the output reference terminal of the third rectifying unit, the inductor L3 is connected between the input terminal of the third rectifying unit and the output terminal of the third rectifying unit, a first terminal of the capacitor Cc3 is connected to a path that connects between the inductor L3 and the output terminal of the third rectifying unit, a second terminal of the capacitor Cc3 is connected to the output reference terminal of the third rectifying unit, a cathode of the diode Db3 is connected to a path that connects between the inductor L3 and the input terminal of the third rectifying unit, an anode of the diode Db3 is connected to the input reference terminal of the third rectifying unit, the fourth rectifying unit includes an inductor L4, a capacitor Cc4, and a diode Db4, the input reference terminal of the fourth rectifying unit is connected with the output reference terminal of the fourth rectifying unit, the inductor L4 is connected between the input terminal of the fourth rectifying unit and the output terminal of the fourth rectifying unit, a first terminal of the capacitor Cc4 is connected to a path that connects between the inductor L4 and the output terminal of the fourth rectifying unit, a second terminal of the capacitor Cc4 is connected with the output reference terminal of the fourth rectifying unit, an anode of the diode Db4 is connected to a path that connects between the inductor L4 and the input terminal of the fourth rectifying unit, and a cathode of the diode Db4 is connected with the input reference terminal of the fourth rectifying unit.

18. The signal generation circuit according to claim 1, further comprising:

a first insulating element; and a second insulating element, wherein the first input signal is a signal that has been transmitted with electrical isolation via the first insulating element, and the second input signal is a signal that has been transmitted with electrical isolation via the second insulating element.

19. The signal generation circuit according to claim 18, wherein the first insulating element is a first electromagnetic field resonance coupler, the second insulating element is a second electromagnetic field resonance coupler, the first input signal is a high frequency signal that has been transmitted with electrical isolation via the first electromagnetic field resonance coupler, and the second input signal is a high frequency signal that has been transmitted with electrical isolation via the second electromagnetic field resonance coupler.

* * * * *